United States Patent
Gebrehiwot et al.

(10) Patent No.: US 10,576,590 B2
(45) Date of Patent: Mar. 3, 2020

(54) TORQUE CONTROLLED DRIVER APPARATUS AND METHOD

(71) Applicant: Intel Corporation, Santa Clara, CA (US)

(72) Inventors: Batsegaw K. Gebrehiwot, Chandler, AZ (US); Joseph B. Petrini, Gilbert, AZ (US); Nicholas S. Haehn, Scottsdale, AZ (US); Shankar Devasenathipathy, Tempe, AZ (US); Robert L. Sankman, Phoenix, AZ (US); Alfredo G. Cardona, Chandler, AZ (US)

(73) Assignee: Intel Corporation, Santa Clara ( * ) Notice: Subject to any disclaimer, the term of this patent is extended or adjusted under 35 U.S.C. 154(b) by 484 days.

(21) Appl. No.: 15/358,016

(22) Filed: Nov. 21, 2016

(65) Prior Publication Data

US 2018/0141173 A1    May 24, 2018

(51) Int. Cl.
*B23P 19/06* (2006.01)
*H05K 1/02* (2006.01)
*H01L 23/40* (2006.01)

(52) U.S. Cl.
CPC ............ *B23P 19/069* (2013.01); *B23P 19/06* (2013.01); *B23P 19/066* (2013.01); *H01L 23/4006* (2013.01); *Y10T 29/49963* (2015.01)

(58) Field of Classification Search
CPC ....... B23P 19/06; B23P 19/065; B23P 19/066; B23P 19/069; B23P 2700/09;
(Continued)

(56) References Cited

U.S. PATENT DOCUMENTS 6,660,563 B1 * 12/2003 Cromwell ........... H01L 23/4006
257/678
8,826,777 B1 * 9/2014 Shieh ..................... B25B 17/00
81/57.22
(Continued)

OTHER PUBLICATIONS

Stöger Automation, List of Products, https://www.stoeger.com/en/list-of-products.html, Nov. 21, 2016, 14 pages.
(Continued)

*Primary Examiner* — Peter Dungba Vo
*Assistant Examiner* — Joshua D Anderson
(74) *Attorney, Agent, or Firm* — Schwabe, Williamson & Wyatt, P.C.

(57) ABSTRACT

Embodiments herein relate to torque controlled drivers to simultaneously drive fasteners to secure a thermal transfer device to an integrated circuit package. In various embodiments, a torque controlled driver may include a gearbox, a driver with a torque controller and a motor with a rotating shank, a motor gear coupled concentrically with the rotating shank, a bit drive gear in rotational engagement with the motor gear to drive a bit sized to drive a fastener to secure a thermal transfer device to an integrated circuit package, where the gearbox is to hold the motor gear in a position about a motor gear rotational axis and the drive gear about a drive gear rotational axis such that the motor gear and the bit drive gear maintain rotational engagement as the motor gear rotates. Other embodiments may be described and/or claimed.

5 Claims, 8 Drawing Sheets

(58) Field of Classification Search
CPC . B23P 2700/10; H05K 1/0203; H05K 1/0204; H05K 1/0209; H05K 7/1407; Y10T 29/49947; Y10T 29/49963; Y10T 29/43113; Y10T 29/5313; Y10T 29/53174; H01L 23/4006
See application file for complete search history.

(56) References Cited

U.S. PATENT DOCUMENTS

2003/0226427 A1* 12/2003 Rosetto ............... B23P 19/069
 81/57.22
2017/0196075 A1* 7/2017 Barron ............... H05K 1/0204

OTHER PUBLICATIONS

ASA Enterprise Corp., Multi-spindle Auto Screw-tightening Machines, http://www.ttnet.net/ttnet/gotoprd/ID129/999/0/25651303031333333373.htm, Nov. 21, 2016, 5 pages.
Alibaba.com, Screw fixing machine/ keyboards assembly machine, http://www.alibaba.com/product-detail/Screw-fixing-machine-keyboards-assembly-machine_1169561236.html?spm=a2700.7724838.0.0.qrHZAA+%C3%A2%C2%80%C2%8E, Nov. 21, 2016, 4 pages.

* cited by examiner

TORQUE CONTROLLED DRIVER APPARATUS AND METHOD

FIELD

Embodiments of the present disclosure generally relate to the field of thermal solution attachment to a package containing one or more dies and, more particularly, to attaching thermal transfer devices to semiconductor packages by tightening fasteners with a torque controlled driver.

BACKGROUND

Thermal transfer devices such as heat pipes, heat spreaders, or heatsinks are typically attached to multi-chip packages by tightening screws one at a time in a specified sequence. The sequence of screw tightening may be selected to minimize the applied peak pressure on the die or dice in the package during the thermal transfer device attachment process. However, in this legacy technique of screw tightening, skewed loading is introduced and maximum pressure is observed to be applied on a die or dice before the last screw is tightened, which may result in pressure high enough to crack the die or dice during attachment of the thermal transfer device. Additionally, the gap between two screws may be smaller than a minimum central distance between two torque screwdrivers that are adjacent to each other such that two torque screwdrivers cannot be simultaneously used to tighten the screws.

BRIEF DESCRIPTION OF THE DRAWINGS

Embodiments herein may overcome the above-described limitations. The techniques will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
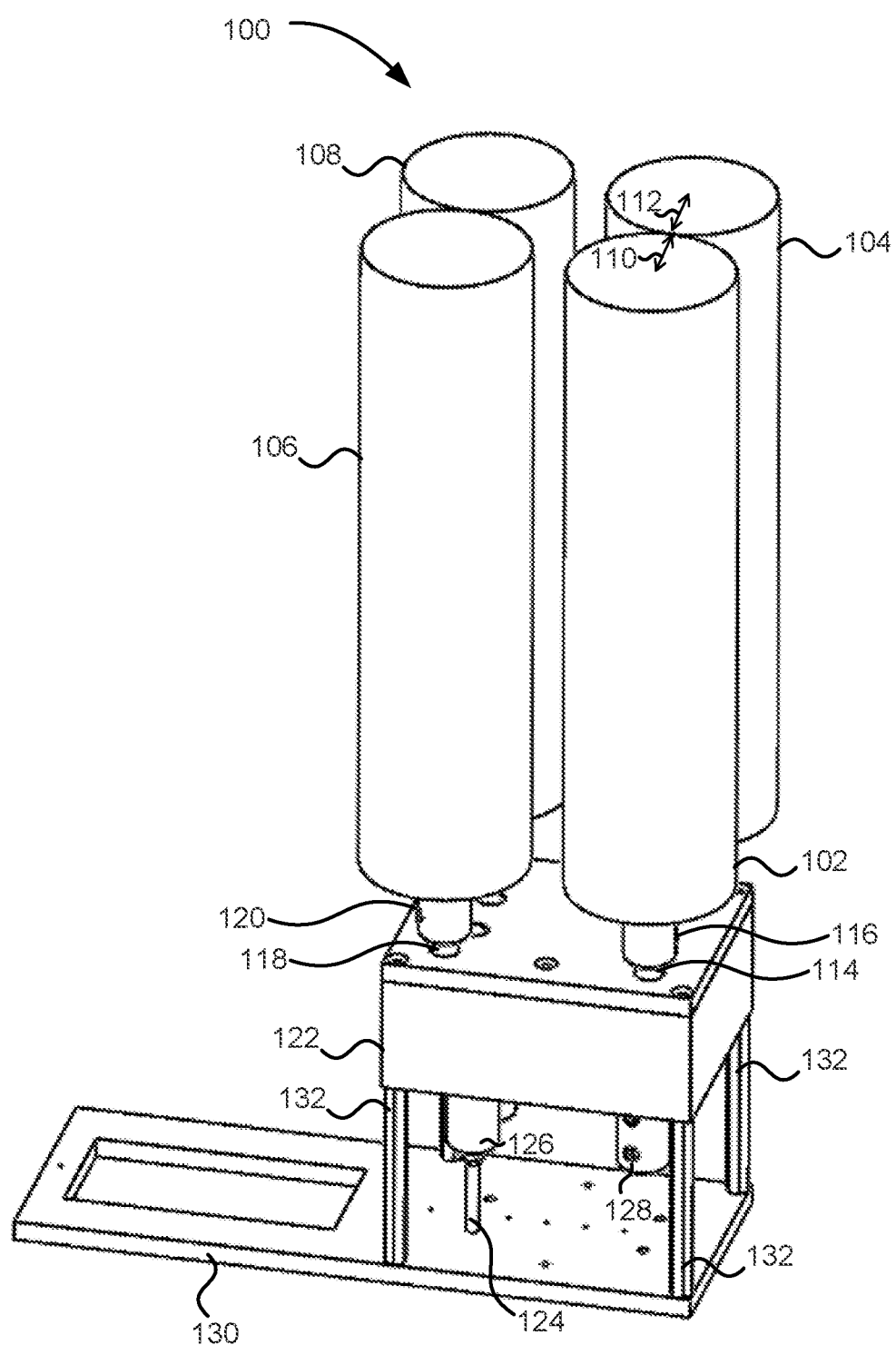
FIG. 1 is a diagram of a torque controlled simultaneous driver with multiple motors, according to various embodiments.

Embodiments of the present disclosure describe devices, systems, and techniques to simultaneously drive fasteners to secure a thermal transfer device to an integrated circuit package. In various embodiments, a torque controlled driver may include a gearbox, a driver with a torque controller and a motor with a rotating shank, a motor gear coupled concentrically with the rotating shank, a bit drive gear in rotational engagement with the motor gear to drive a bit sized to drive a fastener to secure a thermal transfer device to an integrated circuit package, where the gearbox is to hold the motor gear in a position about a motor gear rotational axis and the drive gear about a drive gear rotational axis such that the motor gear and the bit drive gear maintain rotational engagement as the motor gear rotates.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. It will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

As used herein, the term "module" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable components that provide the described functionality.

FIG. 1 is a diagram of a torque controlled simultaneous driver 100, according to various embodiments. In some embodiments, the torque controlled simultaneous driver 100 may include a first motor 102, a second motor 104, a third motor 106, and a fourth motor 108. In various embodiments, a different number of motors may be used to drive a corresponding number of fasteners. In various embodiments, each of the motors may include a torque controller, not shown for clarity, which may be adjustable in some embodiments. In embodiments, the torque controller of each motor may have an approximate torque setting range of approximately 1.5 kilogram force centimeters (kgf-cm) to 2.5 kgf-cm. A different torque setting range may be used in other embodiments. In some embodiments, the first motor 102 may have a radius 110 and the second motor 104 may have a radius 112. In embodiments, the radius 110 and the radius 112 may each have a minimum radius of approximately 0.5 inches to 1.5 inches. The minimum radii may be different in other embodiments. Each of the motors may have a rotating shank in various embodiments. In some embodiments, the rotating shank may be coupled with a motor gear shaft with a shank coupling. As shown, the first motor 102 may have a rotating shank coupled to a first motor gear shaft 114 with a first shank coupling 116 and the third motor 106 may have a rotating shank coupled to a second motor gear shaft 118 with a second shank coupling 120.

In various embodiments, the shanks of the motors may be coupled with a gear arrangement in a gearbox 122 such that a plurality of drive bits may be simultaneously driven by the motors and may be more closely spaced together than would be possible if the drive bits were concentrically coupled with the rotating shanks due to the radii of the motors (e.g., radius 110 and radius 112). Although only one drive bit 124 is shown for clarity, it should be understood that a drive bit may be coupled with each of the motors via the gearbox 122 in various embodiments. In some embodiments, the drive bits may be coupled to bit drive gear shafts with bit drive gear couplings. In various embodiments, the drive bit 124 may be coupled with a first bit drive gear shaft extending from a first bit drive gear in the gearbox 122 by a first bit drive gear coupling 126. A second bit drive gear coupling 128 may couple a second bit drive gear shaft extending from a second bit drive gear in the gearbox 122 in some embodiments. In various embodiments, the gearbox 122 may be positioned above a platform 130 and may be coupled with the platform by a plurality of legs 132 or other supporting structures that may be adjustable in some embodiments. In embodiments, the bit sizes may be #0 or #1 Phillips screwdriver bits and may drive fasteners such as screws with sizes that may be M2, M2.5, or M3 in various embodiments. Other types of bits, bit sizes, or fastener types or sizes may be used in some embodiments.

In various embodiments, the gear assembly in the gearbox 122 may offset rotational motion and transfer torque from each of the motors such that screws or other fasteners having a gap that is smaller than a central distance between two or more torque drivers positioned adjacent to each other may be tightened simultaneously. In some embodiments, each fastener (e.g., screw) may be tightened using its own torque screwdriver which has its own motor (e.g., motor 102, 104, 106, 108), with all gear systems to offset motion and allow closely spaced fasteners to be simultaneously tightened being located in the gearbox 122. In some embodiments, this may be referred to as an all-in-one gearbox with multiple torque screwdriver system (AOG-MTSS). In embodiments, the fasteners may have a spacing in a range of approximately 0.75 inches to 3 inches that may be less than a central distance between driver motors which may be approximately 1.25 inches in some embodiments. In various embodiments, the spacing between fasteners and/or the central distance between adjacent driver motors may be different. In various embodiments, a controller (not shown for clarity) may generate one or more start and/or stop signals to start and/or stop the motors 102, 104, 106, and 108 simultaneously.

Figure 2:
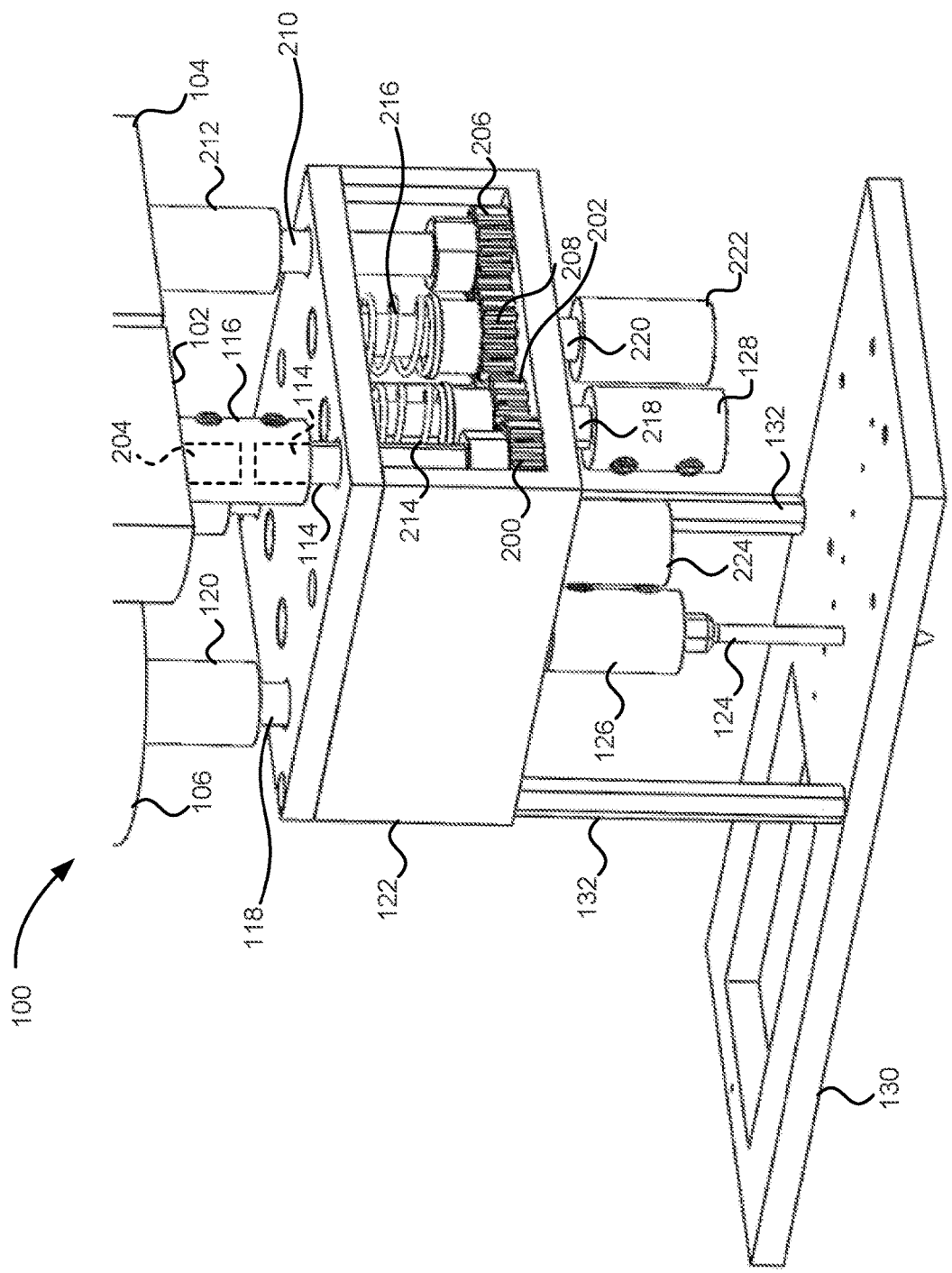
FIG. 2 is a diagram showing additional detail for a gear arrangement of the torque controlled simultaneous driver of FIG. 1, according to various embodiments.

FIG. 2 is a diagram showing additional detail for a gear arrangement of the torque controlled simultaneous driver 100 of FIG. 1, according to various embodiments. In some embodiments, the gearbox 122 may hold a first motor gear 200 in a position about a first motor gear rotational axis and a first bit drive gear 202 about a first bit drive gear rotational axis such that the first motor gear 200 and the first bit drive gear 202 maintain rotational engagement as the first motor gear 200 rotates. In some embodiments, the first bit drive gear shaft 114 may extend from the first motor gear 200 and may be coupled concentrically with a first rotating shank 204 of the first motor 102 by the first shank coupling 116. In various embodiments, the gearbox 122 may hold a second motor gear 206 in a position about a second motor gear rotational axis and a second bit drive gear 208 in a position about a second bit drive gear rotational axis such that the second motor gear 206 and the second bit drive gear 208 maintain rotational engagement as the second motor gear 206 rotates. In some embodiments, a third bit drive gear shaft 210 may extend from the second motor gear 206 and may be coupled concentrically with a rotating shank, not shown for clarity, of the second motor 104 by a third shank coupling 212 in similar fashion to that described with respect to the first shank coupling 116.

In various embodiments, a first spring 214 may provide a first spring force against the first bit drive gear 202 and a second spring 216 may provide a second spring force against the second bit drive gear 208. In some embodiments, the second bit drive gear coupling 128 may be coupled with second bit drive gear shaft 218 extending from the first bit drive gear 202, a third bit drive gear shaft 220 extending from the second bit drive gear 208 may be coupled with a third bit drive gear coupling 222, and a third bit drive gear shaft, not shown for clarity, may be coupled with a fourth bit drive gear coupling 224.

Figure 3:
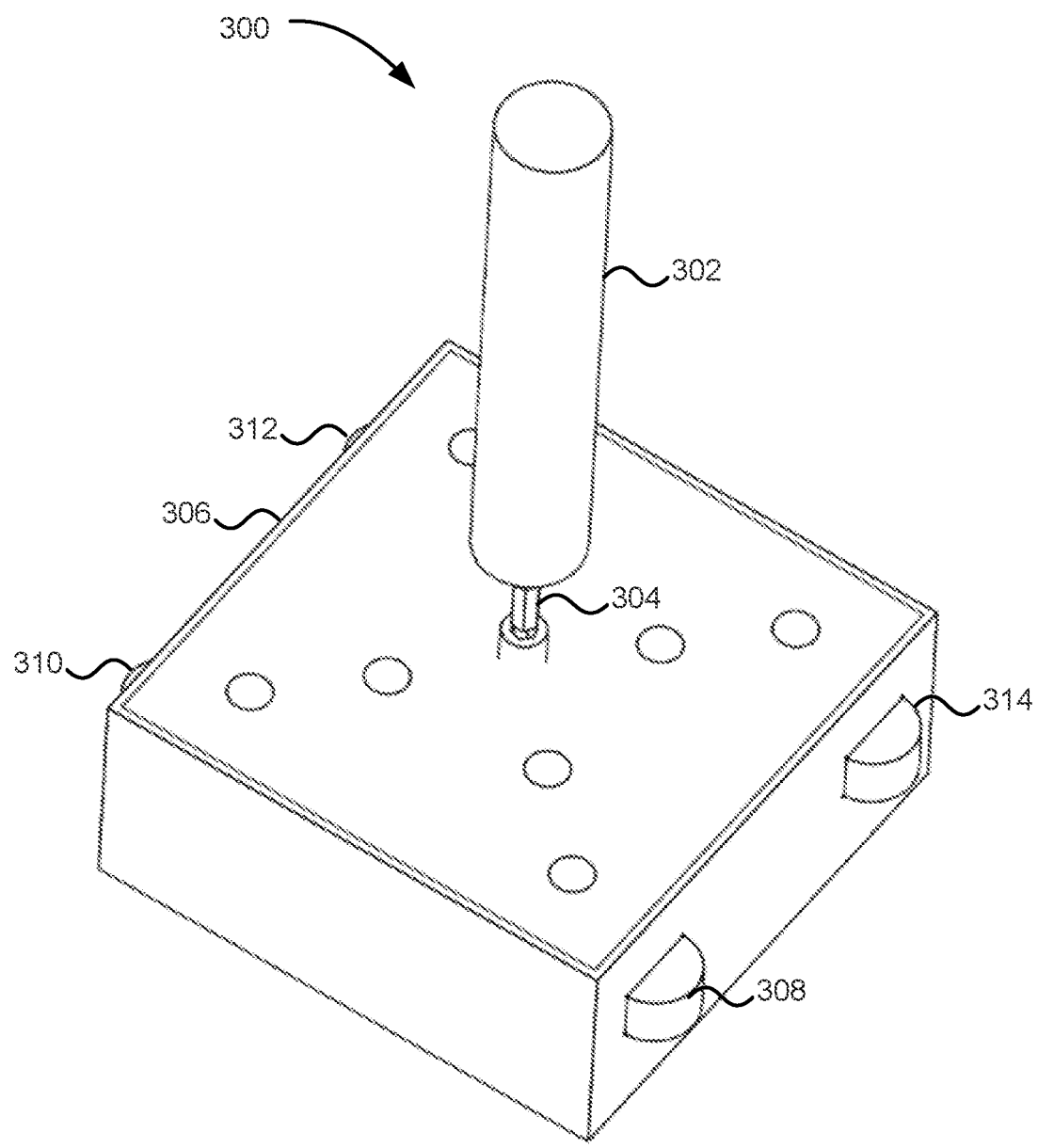
FIG. 3 is a diagram of a torque controlled simultaneous driver with a single motor, according to various embodiments.

FIG. 3 is a diagram of a torque controlled simultaneous driver 300 with a single motor 302, according to various embodiments. In some embodiments, the motor 302 may include a rotating shank 304 coupled with a gear arrangement in a gearbox 306. In various embodiments, the torque controlled simultaneous driver 300 may include a first dial 308 to control a first amount of torque applied to a first fastener, a second dial 310 to control a second amount of torque applied to a second fastener, a third dial 312 to control a third amount of torque applied to a third fastener, and a fourth dial 314 to control a fourth amount of torque applied to a fourth fastener.

Figure 4:
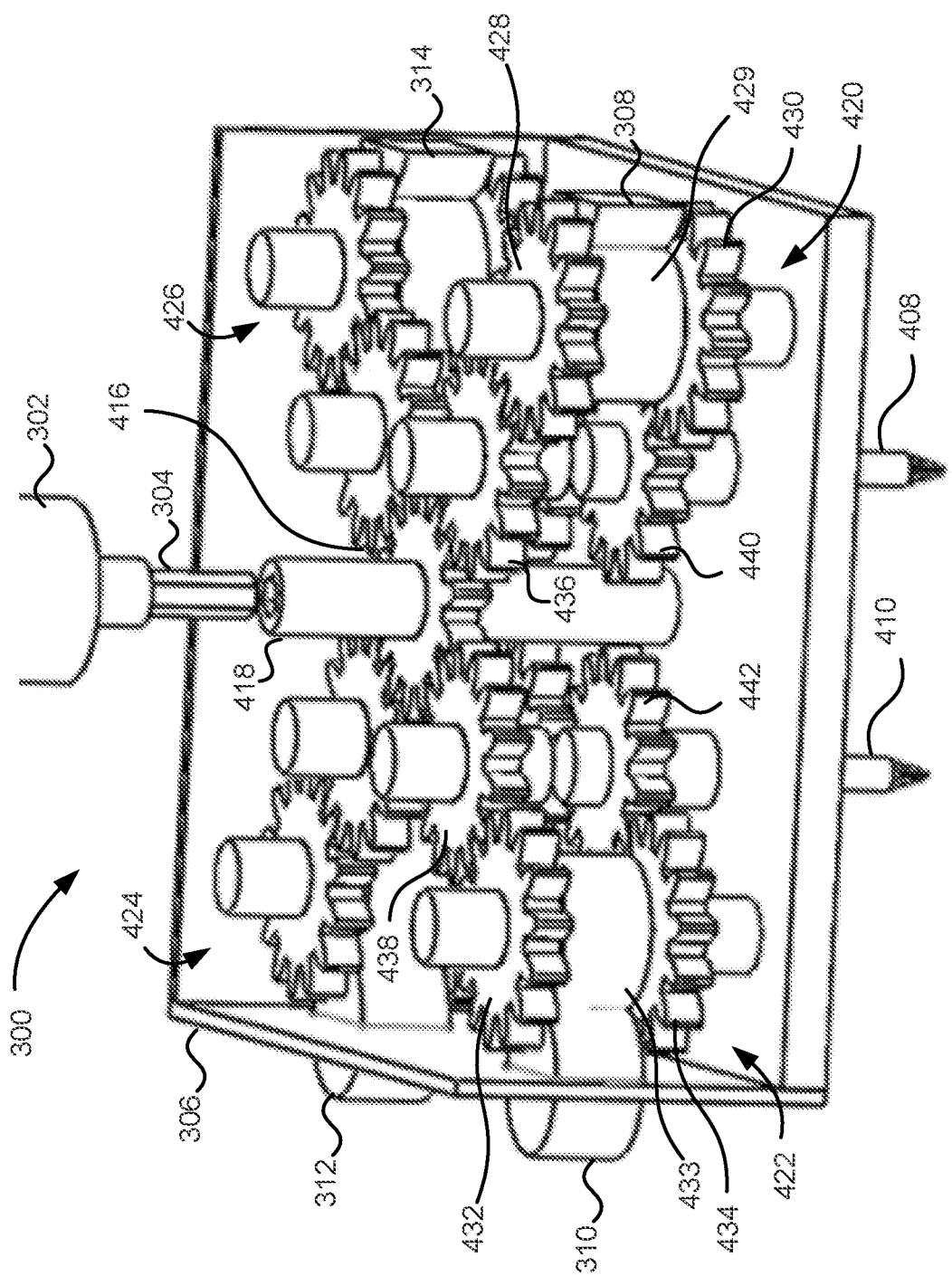
FIGS. 4-5 are diagrams showing additional detail for the torque controlled simultaneous driver of FIG. 3, according to various embodiments.

FIG. 4 is a diagram showing additional detail for the torque controlled simultaneous driver 300 of FIG. 3, according to some embodiments. In various embodiments, the torque controlled simultaneous driver 300 may drive a first bit 408, a second bit 410, a third bit, and a fourth bit. In some embodiments, the gear arrangement in the gearbox 306 may rotationally couple each of the first bit 408, the second bit 410, the third bit, and the fourth bit to the rotating shank 304 such that the motor 302 simultaneously drives all of the bits. In various embodiments, the rotating shank 304 may be coupled with a motor gear 416 by a coupling 418. In some embodiments, the rotating shank 304 may be removably coupled with the motor gear 416 by the coupling 418. The rotating shank 304 is shown in a position removed from the coupling 418, but may be coupled with the coupling 418 in various embodiments. In some embodiments, the rotating shank 304 may be directly coupled with the motor gear 416 rather than being coupled by the coupling 418.

In various embodiments, torque from the motor 302 may be transferred to the bits by a first gear system to transfer torque from the motor to torque control units and a second gear system to transfer torque from the torque control units to the bits to drive individual fasteners. In some embodiments, the first gear system may include the motor gear 416 and a first torque control gear of each torque control unit. In some embodiments, intermediate gears may transfer torque between the motor gear and the first torque control gear of each torque control unit. As shown, the torque controlled simultaneous driver 300 may include a first torque control unit 420, a second torque control unit 422, a third torque control unit 424, and a fourth torque control unit 426. In various embodiments, the first torque control unit 420 may include a first torque control gear 428, a first torque controller 429, and a second torque control gear 430, and the second torque control unit 422 may include a first torque control gear 432, a second torque control unit 433, and a second torque control gear 434. In various embodiments, the first torque controller 429 may allow relative motion between the first torque control gear 428 and the second torque control gear 430 of the first torque control unit 420 based at least in part on a position of the first dial 308. In various embodiments, the second torque controller 433 may allow relative motion between the first torque control gear 432 and the second torque control gear 434 of the second torque control unit 422 based at least in part on a position of the second dial 310. In some embodiments, a first intermediate gear 436 may transfer torque between the motor gear 416 and the first torque control gear 428 of the first torque control unit 420, and a second intermediate gear 438 may transfer torque between the motor gear 416 and the first torque control gear 432 of the second torque control unit 422.

In some embodiments, the first torque control unit 420 may have a first torque control setting (e.g., based at least in part on a position of the first dial 308) such that torque from the motor gear 416 may be transferred to the first bit 408 up to a level of the first torque control setting. In various embodiments, the second torque control unit 422 may have a second torque control setting (e.g., based at least in part on a position of the second dial 310) such that torque from the motor gear 416 may be transferred to the second bit 410 up to a level of the second torque control setting. In some embodiments, the third torque control unit 424 may have a third torque control setting such that torque from the motor gear 416 may be transferred to the third bit up to a level of the third torque control setting (e.g., based at least in part on a position of the third dial 312). In various embodiments, the fourth torque control unit 426 may have a fourth control setting such that torque from the motor gear 416 may be transferred to the fourth bit up to a level of the fourth torque control setting (e.g., based at least in part on a position of the fourth dial 314). In some embodiments, the torque control units may have a common torque control setting rather than having individual torque settings. In embodiments, the torque settings of the torque control units may have an approximate range of 1.5 kgf-cm to 2.5 kgf-cm. A different torque setting range may be used in other embodiments.

In various embodiments, the second gear system may include the second torque control gear and a bit drive gear to transfer torque from the torque control units to the bits to drive individual fasteners. In some embodiments, the torque controlled simultaneous driver 300 may include a first bit drive gear 440 and a second bit drive gear 442. In various embodiments, the first bit drive gear 440 and the first intermediate gear 436 may rotate about a common rotational axis, but may rotate independently of one another. Similarly, in some embodiments, the second bit drive gear 442 and the second intermediate gear 438 may rotate about a common rotational axis, but may rotate independently of one another. In some embodiments, the motor 302 may also include an integrated torque controller (not shown for clarity) that may be set independently of the torque settings of the first torque control unit 420, the second torque control unit 422, the third torque control unit 424, and/or the fourth torque control unit 426. In various embodiments, the integrated torque controller of the motor 302 may be used as a safety feature to ensure none of the fasteners are tightened above a maximum torque setting of the integrated torque controller. In some embodiments, an all-in-one gearbox with a single torque screwdriver system (AOG-STSS) such as the torque controlled simultaneous driver 300 which uses a single motor 302 may be used in an assembly line process for attaching large numbers of the same type of thermal solutions to IC packages. Similarly, an AOG-MTSS such as the torque controlled simultaneous driver 100 may be used for attaching large numbers of the same type of thermal solutions to IC packages. In various embodiments, both of these solutions use an all-in-one gearbox with fixed bit positions, and accordingly may be most suitable for attachment of large numbers of the same type of thermal solutions having common fastener positions.

Figure 5:
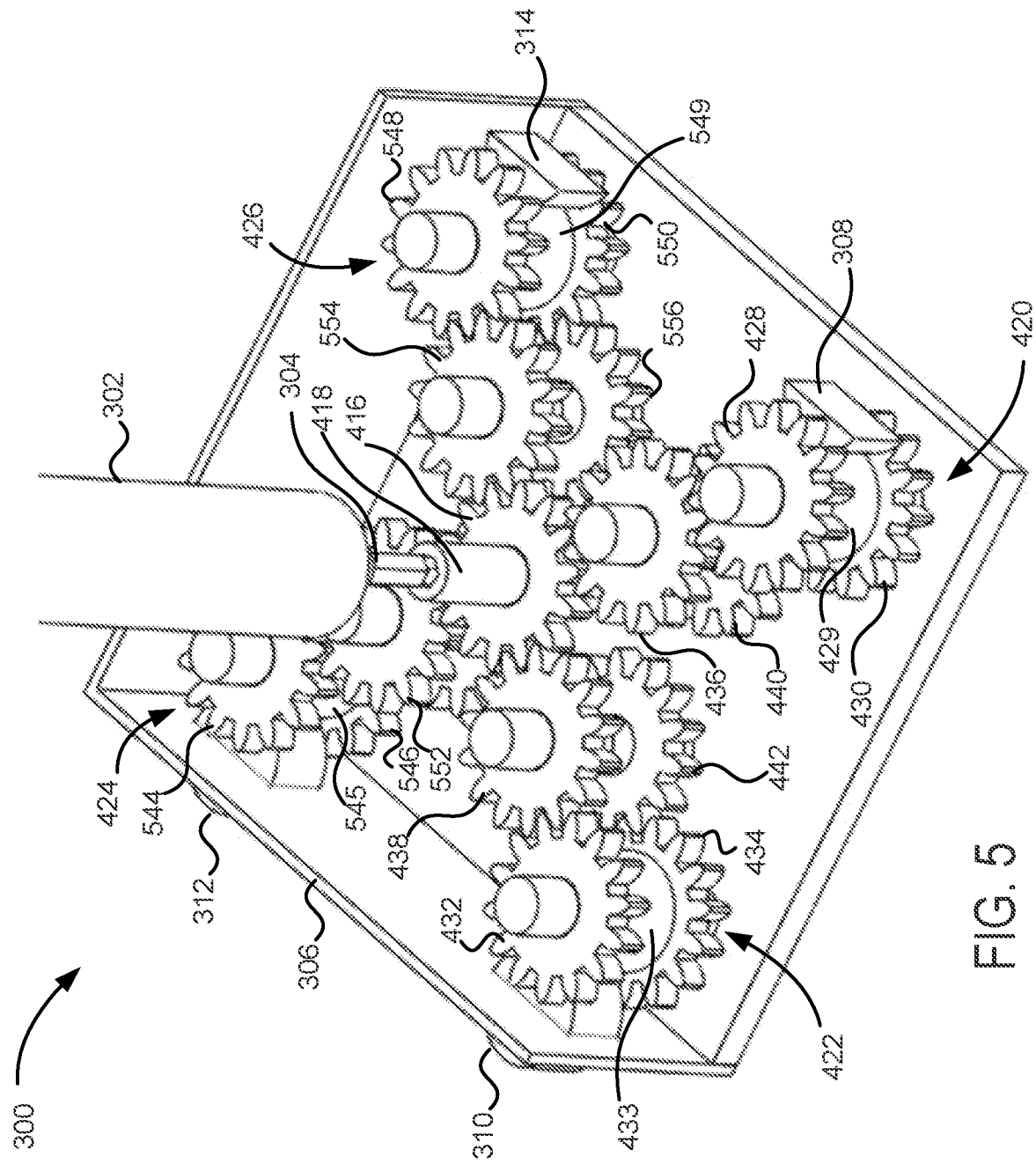

FIG. 5 is another diagram showing additional detail for the torque controlled simultaneous driver 300 of FIG. 3, according to various embodiments. In particular, FIG. 5 shows additional detail for the gear systems that may be used to drive the third bit and the fourth bit in some embodiments. In various embodiments, the third torque control unit 424 may include a first torque control gear 544, a third torque controller 545, and a second torque control gear 546, and the fourth torque control unit 426 may include a first torque control gear 548, a fourth torque controller 549, and a second torque control gear 550 in similar fashion to that described with respect to the first torque control unit 420 and the second torque control unit 422. In some embodiments, the third torque controller 545 may allow relative motion between the first torque control gear 544 and the second torque control gear 546 of the third torque control unit 424 based at least in part on a position of the third dial 312. In various embodiments, the fourth torque controller 549 may allow relative motion between the first torque control gear 548 and the second torque control gear 550 of the fourth torque control unit 426 based at least in part on a position of the fourth dial 314. In some embodiments, a third intermediate gear 552 may transfer torque between the motor gear 416 and the first torque control gear 544 of the third torque control unit 424. In various embodiments, a fourth intermediate gear 554 may transfer torque between the motor gear 416 and the first torque control gear 548 of the fourth torque control unit 426.

In some embodiments, the torque controlled simultaneous driver 300 may include a third bit drive gear, not labeled for clarity, and a fourth bit drive gear 556. In various embodiments, the third bit drive gear and the third intermediate gear 552 may rotate about a common rotational axis, but may rotate independently of one another. Similarly, in some embodiments, the fourth bit drive gear 556 and the fourth intermediate gear 554 may rotate about a common rotational axis, but may rotate independently of one another. In embodiments, the third bit drive gear may drive the third bit and the fourth bit drive gear 556 may drive the fourth bit in similar fashion to the way the first bit drive gear 440 drives the first bit 408 and the second bit drive gear 442 drives the second bit 410.

Figure 6:
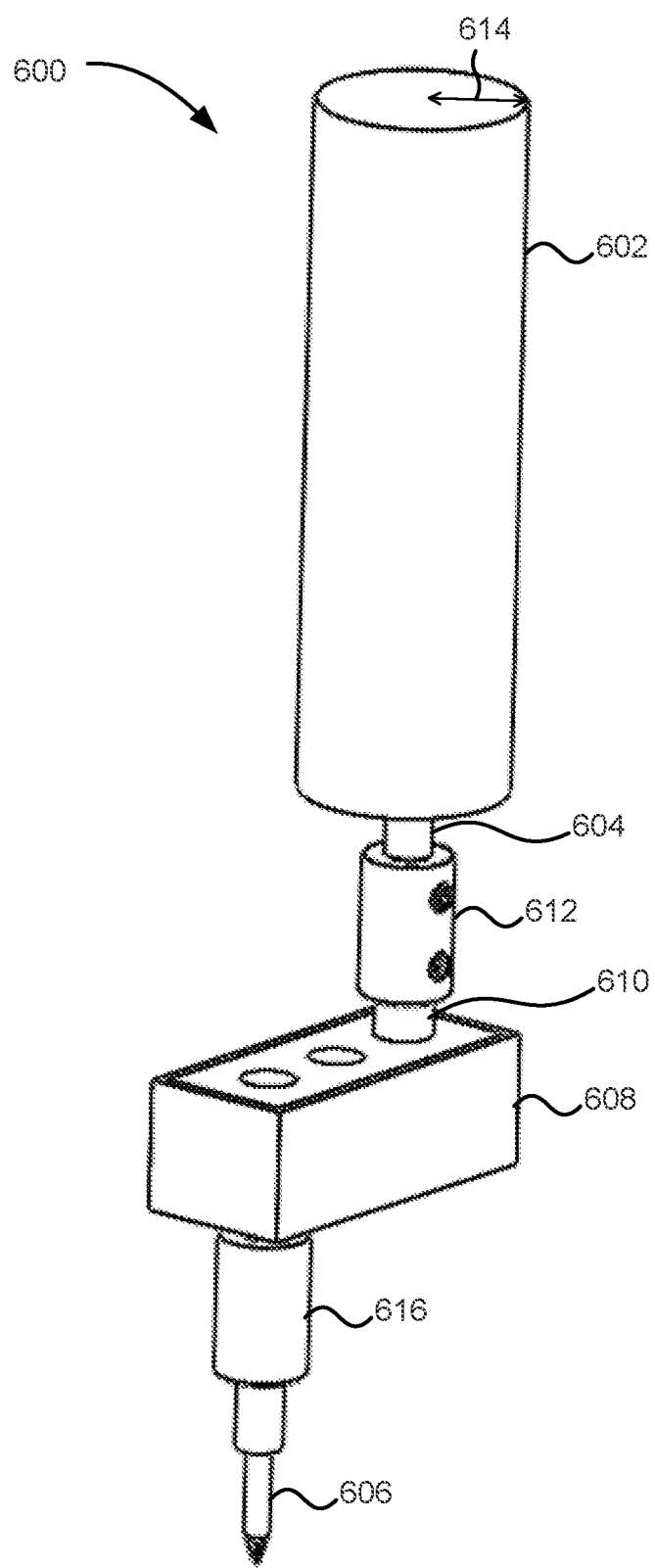
FIG. 6 is a diagram of a torque controlled driver, according to various embodiments.

FIG. 6 is a diagram of a torque controlled driver 600, according to various embodiments. In some embodiments, the torque controlled driver 600 may include a motor 602 with an integrated torque controller, not shown for clarity, which may be adjustable. In various embodiments, the motor 602 may include a rotating shank 604. In some embodiments, the rotating shank 604 may drive a bit 606 that is offset from a rotational axis of the rotating shank 604. In various embodiments, the rotating shank 604 may be coupled with the bit 606 via a gear assembly in a gearbox 608. In some embodiments, the rotating shank 604 may be coupled with a motor gear shaft 610 with a shank coupling 612. In various embodiments, the motor 602 may have a radius 614. In some embodiments, a bit drive gear coupling 616 may concentrically couple a bit drive gear shaft extending from a bit drive gear in the gearbox 608 to the bit 606.

Figure 7:
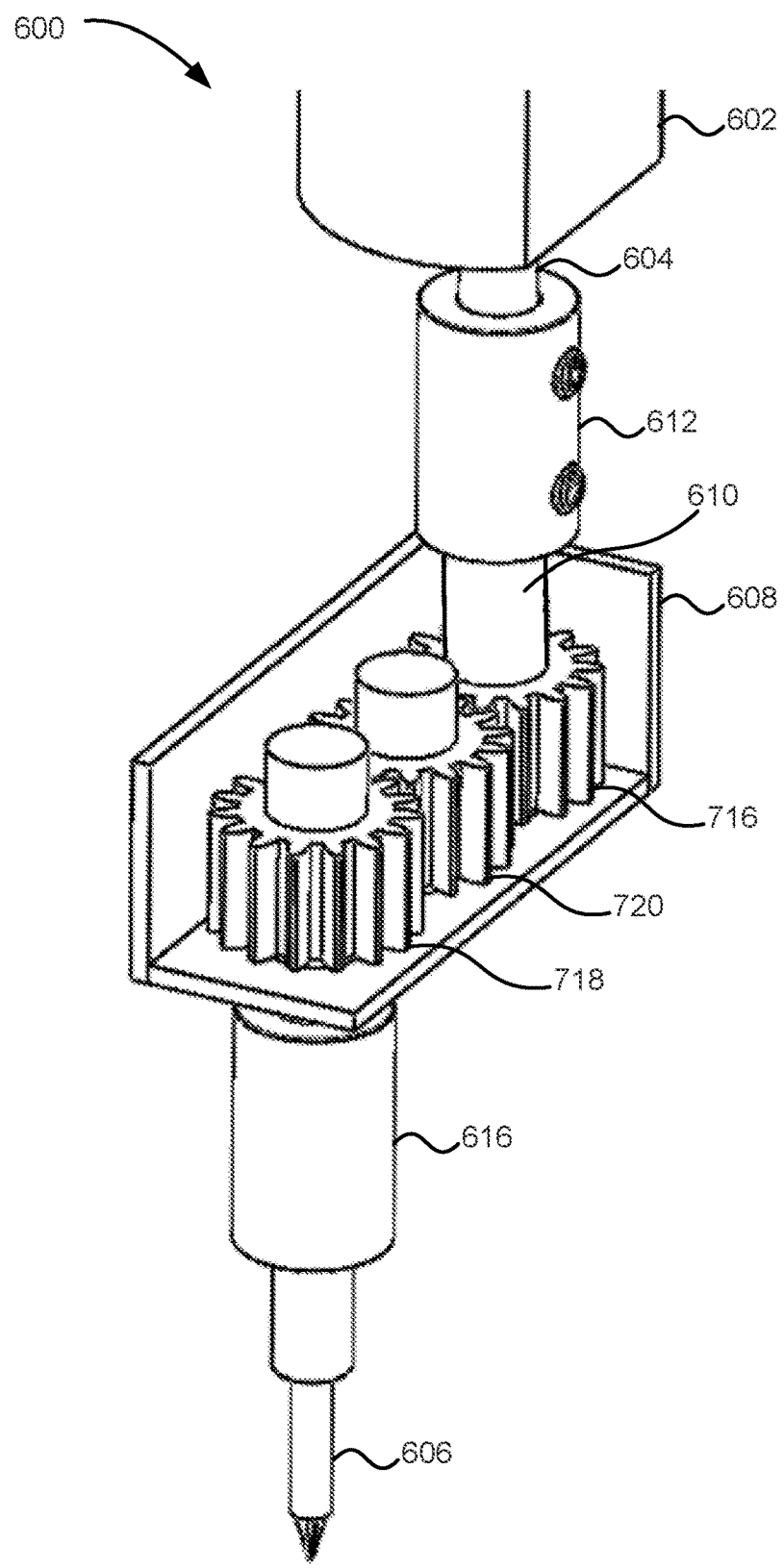
FIG. 7 is a diagram showing additional detail for the torque controlled driver of FIG. 6, according to various embodiments.

FIG. 7 is a diagram showing additional detail for the torque controlled driver 600 of FIG. 6, according to various embodiments. In some embodiments, the gear assembly in the gearbox 608 may include a motor gear 716 that may transfer torque to a bit drive gear 718. In various embodiments, an intermediate gear 720 may be in rotational engagement with both the motor gear 716 and the bit drive gear 718. In some embodiments, the intermediate gear 720 may not be present and the motor gear 716 may be rotationally engaged with the bit drive gear 718 directly rather than through the intermediate gear 720. In some embodiments, multiple torque controlled drivers 600 may be used to simultaneously tighten fasters that attach a thermal transfer device to an IC package. In various embodiments, this may allow fasteners that are more closely spaced than twice the radius 614 of the motor 602 to be simultaneously fastened. In various embodiments, use of multiple torque controlled drivers, each with an individual gearbox system (IGS), such as the gear assembly in the gearbox 608 of the torque controlled driver 600, may allow repositioning of the torque controlled drivers to adjust for varying gaps between fasteners, such as when different types of thermal solutions are to be attached to different IC packages.

In various embodiments, the motor gear 716 is concentric with the rotating shank 604 and the bit drive gear 718 is concentric with the bit 606, and accordingly, the screw or other fastener to be driven by the bit 606. In some embodiments, the motor gear shaft 610 may extend from the motor gear 716 and may be connected to the rotating shank 604 by the shank coupling 612 such that there is no relative motion between the rotating shank 604 and the motor gear 716. In various embodiments, a bit drive gear shaft may extend from the bit drive gear 718 may be connected to the bit 606 by the bit drive gear coupling 616 such that there is no relative motion between the bit drive gear shaft and the bit 606.

Figure 8:
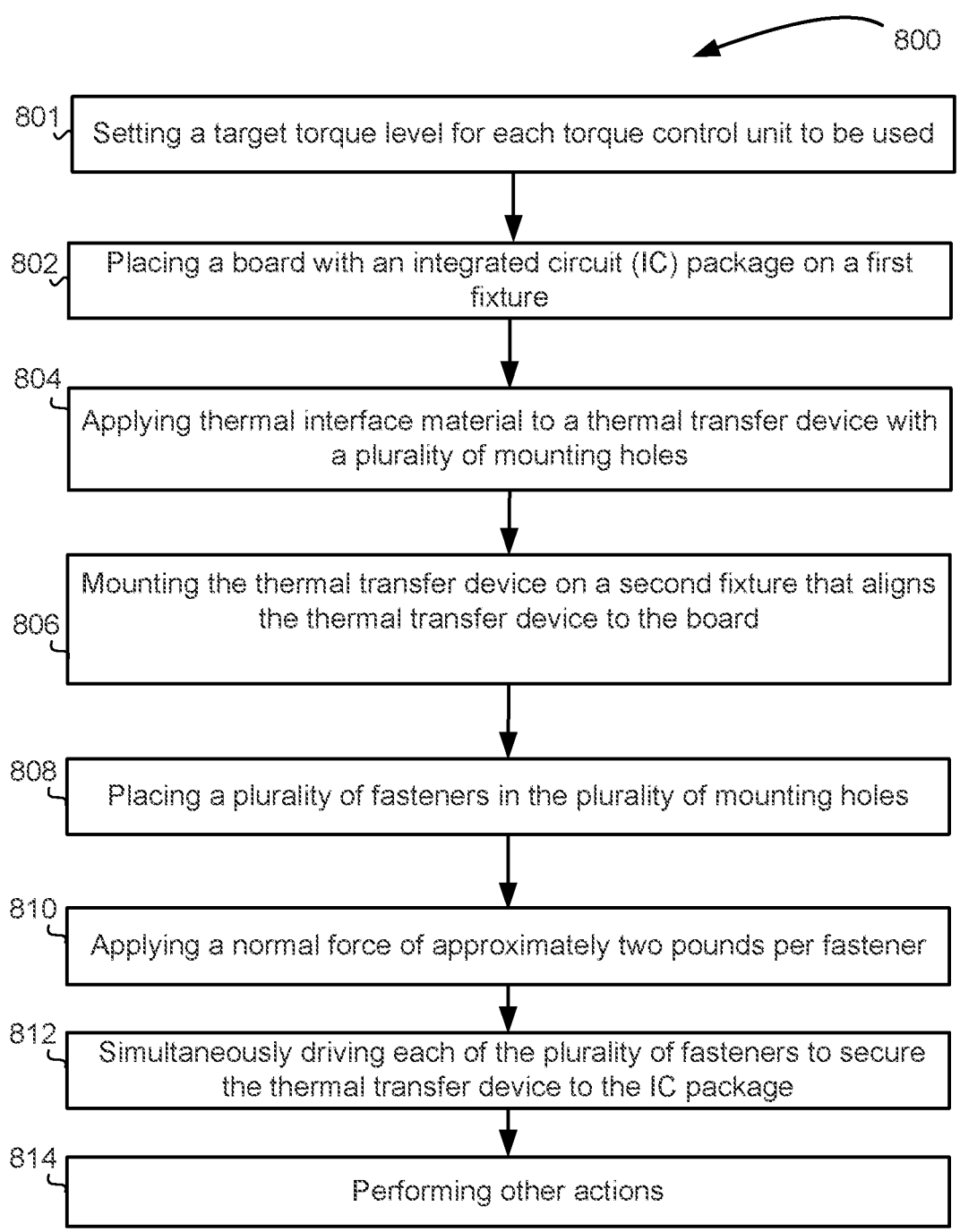
FIG. 8 is a flow diagram illustrating a technique of attaching a thermal transfer device to an integrated circuit package, according to various embodiments.

FIG. 8 is a flow diagram illustrating a technique 800 of attaching a thermal transfer device to an integrated circuit package, according to various embodiments. In embodiments, some or all of the technique 800 may be practiced by components shown and/or described with respect to the torque controlled simultaneous driver 100 of FIG. 1 and/or FIG. 2; the torque controlled simultaneous driver 300 of FIG. 3, FIG. 4, and/or FIG. 5; and/or the torque controlled driver 600 of FIG. 6 and/or FIG. 7.

In various embodiments, the technique 800 may include setting a target torque level for each torque control unit to be used in attaching the thermal transfer device to the integrated circuit package at a block 801. In some embodiments, the technique 800 may include placing a board with an IC package on a first fixture at a block 802. In some embodiments, the IC package may be a multi-chip package (MCP). In various embodiments, the technique 800 may include applying thermal interface material (TIM) to a thermal transfer device with a plurality of mounting holes at a block 804. In some embodiments, at a block 806, the technique 800 may include mounting the thermal transfer device on a second fixture that aligns the thermal transfer device to the board. In various embodiments, the technique 800 may include placing a plurality of fasteners in the plurality of mounting holes at a block 808. In some embodiments, the technique 800 may include applying a normal force of approximately two pounds per fastener at a block 810. In various embodiments, at a block 812, the technique 800 may include simultaneously driving each of the plurality of fasteners to secure the thermal transfer device to the IC package (e.g., with torque controlled simultaneous driver 100, torque controlled simultaneous driver 300, or multiple torque controlled drivers 600). In some embodiments, the technique 800 may include performing other actions at a block 814. In various embodiments, the technique 800 may include adjusting a torque setting of one or more torque controlled drivers before simultaneously driving each of the plurality of fasteners. In some embodiments, the technique 800 may include removing a torque controlled driver assembly from contact with the fasteners after the fasteners are tightened. In various embodiments, the technique 800 may include removing all fasteners at the same time.

EXAMPLES

Example 1 may include a torque controlled driver comprising: a gearbox; a driver with a torque controller and a motor with a rotating shank; a motor gear coupled concentrically with the rotating shank such that there is no relative motion between the motor gear and the rotating shank; and a bit drive gear in rotational engagement with the motor gear to drive a bit sized to drive a fastener to secure a thermal transfer device to an integrated circuit package, wherein the gearbox is to hold the motor gear in a position about a motor gear rotational axis and the drive gear about a drive gear rotational axis such that the motor gear and the bit drive gear maintain rotational engagement as the motor gear rotates.

Example 2 may include the subject matter of Example 1, wherein the driver is a first driver, the torque controller is a first torque controller, the motor is a first motor, the rotating shank is a first rotating shank, the motor gear is a first motor gear, and the bit drive gear is a first bit drive gear, wherein the torque controlled driver further comprises: a second driver, with a second torque controller and a second motor with a second rotating shank; a second motor gear coupled concentrically with the second rotating shank; and a second bit drive gear in rotational engagement with the second motor gear, wherein the gearbox is to hold the second motor gear in position about a second motor gear rotational axis and the second bit drive gears about a second bit drive gear rotational axis such that the second motor gear maintains rotational engagement with the second bit drive gear as the second motor gear rotates.

Example 3 may include the subject matter of Example 2, further comprising: a first drive bit coupled concentrically with the first bit drive gear; and a second drive bit coupled with the second bit drive gear.

Example 4 may include the subject matter of Example 3, further comprising: a first bit drive gear coupling; and a second bit drive gear coupling, wherein a first bit drive gear shaft extends from the first bit drive gear, a second bit drive gear shaft extends from the second bit drive gear, the first drive bit is coupled concentrically with the first bit drive gear shaft with the first bit drive gear coupling, and the second drive bit is coupled concentrically with the second bit drive gear shaft with the second bit drive gear coupling.

Example 5 may include the subject matter of any one of Examples 2-4, further comprising: a first shank coupling; and a second shank coupling, wherein a first motor gear shaft extends from the first motor gear, a second motor shaft extends from the second motor gear, the first motor gear shaft is coupled to the first rotating shank by the first shank coupling, and the second motor gear shaft is coupled to the second rotating shank by the second shank coupling.

Example 6 may include the subject matter of any one of Examples 2-5, further comprising a plurality of intermediate gears, wherein each of the intermediate gears is rotationally coupled with both one of the motor gears and one of the bit drive gears such that each of the motor gears is rotationally coupled with one of the bit drive gears indirectly via one of the plurality of intermediate gears.

Example 7 may include the subject matter of any one of Examples 2-6, wherein the torque controlled driver further comprises: one or more additional drivers, each of the one or more drivers with a torque controller and a motor with a rotating shank; one or more additional motor gears, each of the one or more additional motor gears coupled concentrically with the rotating shank of one of the one or more additional motors; and one or more additional bit drive gears, each of the one or more additional bit drive gears in rotational engagement with one of the additional motor gears, wherein the gearbox is to hold each of the one or more additional motor gears in positions about motor gear rotational axes and each of the additional drive bit gears about bit drive gear rotational axes such that each of the additional motor gears maintains rotational engagement with one of the additional bit drive gears as each of the additional motor gears rotates.

Example 8 may include a torque controlled driver comprising: a gearbox; a motor gear rotationally coupled with the gearbox; a plurality of torque controllers rotationally coupled with the motor gear; a plurality of bit drive gears, wherein each of the plurality of bit drive gears is rotationally coupled with one of the plurality of torque controllers and is to drive a bit sized to drive a fastener to secure a thermal transfer device to an integrated circuit package; and a plurality of drive bits, wherein each of the plurality of drive bits is concentrically coupled with one of the plurality of bit drive gears such that each of the plurality of drive bits does not move relative to the bit drive gear with which it is coupled, wherein the gearbox is to hold the motor gear, the torque controllers, and the plurality of drive bit gears in positions such that the torque controllers remain rotationally coupled with the motor gear as the motor gear rotates and the bit drive gears remain rotationally coupled with the torque controllers.

Example 9 may include the subject matter of Example 8, further comprising a motor with a shank concentrically coupled with the motor gear.

Example 10 may include the subject matter of Example 9, further comprising a plurality of intermediate gears, wherein each of the intermediate gears is rotationally coupled with both the motor gear and one of the plurality of torque controllers, and wherein each of the plurality of torque controllers is rotationally coupled with the motor gear indirectly via one of the plurality of intermediate gears.

Example 11 may include the subject matter of any one of Examples 8-10, wherein the torque controlled driver has four torque controllers, four bit drive gears, and four drive bits.

Example 12 may include the subject matter of any one of Examples 8-11, wherein each of the bit drive gears is closer to the motor gear than each of the torque controllers.

Example 13 may include the subject matter of Example 8, further comprising: a motor with a shank concentrically coupled with the motor gear, wherein the torque controlled driver has four drive torque controllers, four bit drive gears, and four drive bits, wherein each of the bit drive gears are closer to the motor gear than each of the torque controllers.

Example 14 may include a method of attaching a thermal transfer device having a plurality of mounting holes to an integrated circuit (IC) package comprising: placing a board with the IC package on a first fixture; mounting the thermal transfer device on a second fixture that aligns the thermal transfer device to the board; placing a plurality of fasteners in the plurality of mounting holes; and simultaneously driving each of the plurality of fasteners to secure the thermal transfer device to the IC package.

Example 15 may include the subject matter of Example 14, further comprising: applying a normal force of approximately two pounds per fastener before simultaneously driving the plurality of fasteners.

Example 16 may include the subject matter of any one of Examples 14-15, wherein simultaneously driving includes simultaneously starting a plurality of torque controlled drivers.

Example 17 may include the subject matter of Example 16, wherein the plurality of torque controlled drivers are torque controlled screwdrivers.

Example 18 may include the subject matter of any one of Examples 16-17, wherein simultaneously driving the plurality of torque controlled drivers includes: driving the plurality of torque controlled drivers with a single motor.

Example 19 may include the subject matter of any one of Examples 14-18, further comprising applying thermal interface material to the thermal transfer device before simultaneously driving each of the plurality of fasteners.

Example 20 may include the subject matter of any one of Examples 14-19, wherein the thermal transfer device is a heat pipe.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

What is claimed is:

1. A method comprising:
   mounting a torque controlled driver on a platform that includes:
   at least first and second fasteners to be fastened into corresponding mounting holes, the torque controlled driver including a motor coupled with a gear arrangement adapted to simultaneously drive first and second bits, to simultaneously fasten the first and second fasteners respectively, the gear arrangement including:
   a first torque control unit having a first top torque control gear coupled with the motor, a first torque controller coupled with the first top torque control gear, and a first bottom torque control gear coupled with the first torque controller and with the first bit to drive the first bit, wherein the first torque controller includes a first dial to allow for a relative motion between the first top torque control gear and the first bottom torque control gear based on a position of the first dial; and
   a second torque control unit having a second top torque control gear coupled with the motor, a second torque controller coupled with the second top torque control gear, and a second bottom torque control gear coupled with the second torque controller and with the second bit to drive the second bit, wherein the second torque controller includes a second dial to allow for a relative motion between the second top torque control gear and the second bottom torque control gear based on a position of the second dial; and
   simultaneously driving the first and second fasteners into the corresponding mounting holes with the torque controlled driver, to secure a thermal transfer device to an IC package with the first and second fasteners.

2. The method of claim 1, further comprising: applying a normal force of two pounds per fastener to the first and second bits before simultaneously driving the first and second fasteners.

3. The method of claim 1, wherein simultaneously driving includes simultaneously starting the first and second torque control units.

4. The method of claim 1, wherein the torque controlled driver is a torque controlled screwdriver.

5. The method of claim 3, wherein simultaneously driving the first and second control units includes: driving the torque controlled driver with the motor.

* * * * *